United States Patent [19]
Fitzmorris

[11] Patent Number: 5,363,249
[45] Date of Patent: Nov. 8, 1994

[54] SELF SWITCHING HEAD DAMPING

[75] Inventor: Michael Fitzmorris, Santa Ana, Calif.

[73] Assignee: Silicon Systems, Inc., Tustin, Calif.

[21] Appl. No.: 839,351

[22] Filed: Feb. 20, 1992

[51] Int. Cl.$^5$ .................. G11B 5/09; G11B 15/12
[52] U.S. Cl. .......................................... 360/46; 360/62
[58] Field of Search ............ 360/32, 46, 62, 61, 360/67, 68, 65

[56] References Cited

U.S. PATENT DOCUMENTS

| | | | |
|---|---|---|---|
| 3,763,383 | 10/1973 | Johnson | 360/46 |
| 4,159,489 | 6/1979 | Braitberg | 360/65 |
| 4,249,219 | 2/1981 | Aoi et al. | 360/46 |
| 4,266,254 | 5/1981 | Hobrecht et al. | 360/62 |
| 4,724,495 | 2/1988 | Hedberg et al. | 360/32 |
| 4,816,934 | 3/1989 | Tsuyuguchi | 360/46 |

Primary Examiner—Donald Hajec
Assistant Examiner—Won Tae C. Kim
Attorney, Agent, or Firm—Hecker & Harriman

[57] ABSTRACT

An apparatus for damping the ringing effects across the output terminals of a read/write circuit during write operation is described. The present invention introduces a first continuous damping resistance across the inductive load of the read/write head during the write operation, and automatically removes the damping resistance during the read operation. The circuit of the present invention also allows for a second damping resistance suitable for read mode attenuation to be placed directly across the output terminals. The equivalent damping resistance during the write mode is then the resistance of the second damping resistor in parallel with the resistance of the first damping resistor. The damping resistance causes exponential damping of the ringing signal elements, thereby reducing the settling time of the circuit and increasing the operating frequency range.

12 Claims, 4 Drawing Sheets

SELF SWITCHING HEAD DAMPING

BACKGROUND OF THE INVENTION

1. Field of the Invention

This invention relates generally to the field of magnetic storage devices and specifically to read/write head circuitry.

2. Background Art

In magnetic recording devices, such as magnetic disks and tapes, a recording head is used to read and write information to and from the magnetic surface. In a typical rotating medium based storage system, data is stored on magnetic disks in a series of concentric "tracks." These tracks are accessed by a read/write head that detects variations in the magnetic orientation of the disk surface. The read/write head moves back and forth radially on the disk under control of a head-positioning servo mechanism so that it can be selectively positioned over a selected one of the tracks. Once in position over a track, the servo mechanism causes the head to trace a path that follows the center line of the selected track.

A simple configuration of a conventional inductive recording head is illustrated in FIG. 1. The inductive recording head consists of a slit toroid (10) made up of high permeability magnetic material and wound by several conductor turns (11). The toroid contains a gap (12) which is positioned over data tracks (13) on the magnetic recording surface (14).

To record, a current is generated through the conductor windings, altering the magnetic field in the toroid. At the location of the gap, the amplitude of the magnetic field is large enough to record on the magnetic material of the storage device to a sufficient depth. The amplitude of the magnetic field falls off sharply away from the gap. By manipulating the current through the conductor windings, the magnitude and direction of the magnetic flux at the location of the gap can be modulated in such a fashion as to encode information into the magnetic surface of the storage device. A pattern of external and internal fields are created as the head and recording surface are moved relative to each other. These patterns are similar to a series of bar magnets of changing polarities. The polarity transitions are then readable as transitions in the magnetic flux at the recording surface. In read mode, as the magnetic storage surface moves across the gap in the head, the magnetic field of the storage surface is detected at the gap, and a voltage is induced in the coil proportional to the rate of change of the flux. The read circuit then amplifies this analog voltage signal. The amplified readback voltage signal would then be processed and decoded by the read channel circuitry into digital data.

Due to the inductive characteristics of the head and the circuit and stray capacitance of the read/write circuitry, the write current that can be generated through the head are prone to ringing effects. An equivalent circuit representing the impedance at the terminals coupling the read/write circuitry to the head is shown in FIG. 2. Nodes HX and HY represent the I/O terminals of the read/write circuitry for operating on a single head. An inductance, L, representing the head inductance, is coupled between terminals HX and HY. Coupled in parallel with the inductance are capacitance C, representing the circuit and stray capacitance, and current source IW, representing the write current. Assuming a unit step current input at time t=0, the inductor current is given by the equation:

$$i_L(t) = 1 - 2\cos(\omega_o t) \quad \text{(equation 1)}$$

where $\omega_o^2 = 1/(LC)$. The ringing in the circuit results from the cosine element in the equation.

This ringing effect restricts the operating frequency range of the circuit. The write circuit can not change the current for the following data bits until this current has stabilized. For this reason the maximum operating frequency of the head circuitry is directly affected by the settling time of the inductor current. One way to reduce the ringing in the circuit is to introduce a damping resistance in parallel with the inductance. This shunt resistance introduces an exponential attenuation factor into the current equation that causes the ringing signal to decrease over time.

A standard damping scheme is illustrated in FIG. 3. FIG. 3 illustrates a simplified view of the write driving circuitry with a damping resistor (Rd) coupled between terminals HY and HX. This write driver is commonly known as an "H" bridge. Terminals HY and HX are each coupled to one terminal of the head inductor. NPN transistor Q1 has its collector coupled to the positive voltage supply and its base coupled through resistance R1 to the positive voltage supply. NPN transistor Q2 has its collector coupled to the positive voltage supply and its base coupled through R2 to the positive voltage supply. NPN transistors Q3 and Q4 are emitter coupled to the write current source. The base contacts of transistors Q3 and Q4 are coupled to WD and WD* (write data and write data*) signals respectively. The emitter of transistor Q1 and the collector of transistor Q3 are coupled to terminal HY. The emitter of transistor Q2 and the collector of transistor Q4 are coupled to terminal HX. The collectors of transistors Q31 and Q32 are coupled to the bases of transistors Q1 and Q2, respectively. The bases of transistors Q31 and Q32 are coupled to WD and WD*, respectively, and the emitters of Q31 and Q32 are coupled to respective current sources.

Transistors Q3 and Q4 are used to direct the write current. Transistors Q31 and Q32 selectively turn off Q1 or Q2 as required by Q3 and Q4. When signal WD* is high, the current flows from the positive voltage supply through transistor Q1 into terminal HY. The current then passes through damping resistor $R_d$ in parallel with the head inductor to terminal HX where it is directed by transistor Q4 to the write current source. In the alternative case, when signal WD is high, the write current passes through transistor Q2 to terminal HX, across the parallel resistance and inductance to terminal HY and down through transistor Q3.

An equivalent circuit model for the load at terminals HX and HY is shown in FIG. 4. The circuit of FIG. 4 is the same as the circuit of FIG. 2, except for the addition of the damping resistance, Rd, coupled between nodes HX and HY. The current equation for this circuit, assuming a unit step input at time t=0, is given by:

$$i_L(t) = 1 - 2(\omega_o/\omega_d)[e^{-\alpha t}\cos(\omega_d t - \phi)] \quad \text{(equation 2)}$$

where $\omega_o^2 = 1/(LC)$, $\alpha = 1/(2RC)$, $\omega_d^2 = \omega_o^2 - \alpha^2$, and $\phi = \tan^{-1}(\alpha/\omega_d)$.

For this scheme, the magnitude of the ringing term is a function of the ratio between the LC time constant and the RC time constant, as is the phase. The oscillating frequency of the ringing term is determined by the LC and RC time constants and approaches zero as $\alpha$ approaches $\omega_d$. The attenuation of the ringing term is entirely dependent on the RC time constant. It is therefore desirable to have a small damping resistance to facilitate rapid settling of the current. Taking the limit of equation 2 as Rd approaches infinity generates equation 1, which is consistent with what is expected.

The circuit described above, with a simple damping resistor coupled in parallel with the head inductance, is effective in providing damping during the write process. However, the small damping resistance can be counter-productive during a read operation, because it may serve to overly attenuate the analog read signal and cause reading errors.

There are several schemes in the prior art for removing the resistance from the circuit during a read operation. One such scheme is the Schottky isolated damping scheme illustrated in FIG. 5. The circuit shown in FIG. 5 would replace the damping resistance in FIG. 3. In this scheme resistor 300, having a resistance of Rd/2, is coupled between node 304 and terminal HY. Resistor 301, also having a resistance of Rd/2, is coupled between node 305 and terminal HX. Schottky diode 303 is coupled between node 304 and 305 such that it will conduct current from node 304 to node 305 when its forward bias voltage reaches the diode turn-on voltage, $V_d$ (typically 0.5 volts). Schottky diode 302 is coupled between nodes 304 and 305 such that it will conduct current from node 305 to node 304 when its forward bias voltage reaches $V_d$.

With this damping scheme, the diodes act as an open circuit for a potential difference between terminal HX and terminal HY of magnitude less than $V_d$. The resistance between terminals HX and HY for the circuit of FIG. 3 is effectively infinite for the voltage window of $(-V_d<V_{HY-HX}<V_d)$. Outside of this window, the circuit acts as a resistance of $R_d$ in series with a constant voltage source of $V_d$ (assuming an ideal diode). Thus, for read voltages on the order of a few millivolts at most, the damping circuit is cut off.

FIG. 6 illustrates the voltage-current characteristics of the circuit of FIG. 5. The vertical axis represents the potential difference between terminal HY and terminal HX, $V_{HY-HX}$. The horizontal axis represents the current $I_R$ shown in FIG. 5 as running from node 305 to terminal HX. Assuming ideal diodes, the voltage versus current function is linear with a slope of $R_d$ and voltage intercept of minus $V_d$ for currents less than zero. At $I_R=0$, the function achieves an infinite slope for the voltage range from minus $V_d$ to $V_d$. For positive current values, the function is described by a line of slope $R_d$ with a voltage intercept of $V_d$. As shown, for the ideal case and for potential differences having magnitudes less than $V_d$, the circuit behaves as an open circuit, and, as stated with reference to FIG. 5, for potential differences with magnitudes greater than $V_d$, the circuit behaves as a resistor of value $R_d$ in series with a voltage source of magnitude $V_d$.

A disadvantage of the circuit of FIG. 5 is the existence of non-ideal elements in the diode structure, such as resistance and capacitance associated with the layout of the diode. A compromise must be made between the diode size and the resultant resistance and capacitance of the diode structure. Another disadvantage is the inherent diode turn-off and subsequent loss of attenuation at lower levels of ring voltage.

Another damping circuit of the prior art is the switched Schottky clamp circuit shown in FIG. 7. Resistor 300 of resistance Rd/2 is coupled between terminal HY and node 503. Resistor 301, also of resistance Rd/2, is coupled between terminal HX and node 504. NPN Schottky transistor QS1 is coupled between node 503 and 504, with its emitter coupled to node 503, its collector coupled to node 504 and its base coupled to a control node 502. NPN Schottky transistor QS2 is also coupled between 503 and 504, with its emitter coupled to node 504, its collector coupled to node 503 and its base coupled to control node 502. Dependent current source 500 is coupled between $V_{dd}$ and node 502. The value of the current flowing through current source 500 is dependent on the current flowing through current source 501 coupled between $V_{dd}$ and node 505.

Schottky transistors QS1 and QS2 act as standard NPN transistors with a Schottky diode coupled between the base and the collector. For $V_{bc}$ (base-collector voltage) less than $V_d$, the Schottky diode is nonconducting. However, when Vbc reaches the Schottky diode turn-on voltage (approx. 0.5 volts), the Schottky diode begins conducting current between the base and the collector of the transistor. This configuration prevents the transistor from going into the saturation region that is typically around $V_{ce}$ (collector-emitter voltage)=0.2 volts. Rather than entering into the saturation region, the minimum $V_{ce}$ is established by the Schottky turn on voltage and the base-emitter voltage when the transistor is near saturation. Therefore the collector-emitter voltage is prevented from dropping down to saturation, and is restricted to:

$$V_{ce}=V_{be}-V_d\approx 0.8 \text{ volts}-0.5 \text{ volts}\approx 0.3 \text{ volts}$$

For the circuit of FIG. 7, when current source 500 is conducting current, the damping circuit performs as a resistor of value $R_d$ in series with a voltage source of value 0.3 volts. Transistor QS1 conducts current when terminal HX is at a higher potential than terminal HY, and transistor QS2 conducts current when terminal HY is at a higher potential than terminal HX. The voltage versus current characteristics of this circuit are similar to those shown in FIG. 6, with $V_d$ becoming $V_{ce}=0.3$ volts. In read mode, current source 500 does not conduct current and therefore, transistors QS1 and QS2 are shut off, becoming an open circuit.

The circuit of FIG. 7 has advantages over the circuit of FIG. 5 in that during a write operation, the voltage range wherein the damping circuit shuts off is reduced from a 0.5 volt peak range to a 0.3 volt peak range. The disadvantages of the circuit of FIG. 7 are that it requires extra circuitry to implement and the circuit introduces an offset error term to the write current through the head that is equivalent to the current generated in current source 500. Also, although the turn off voltage range as been reduced by 40% over the circuit of FIG. 5, it is preferred that there be no turn-off region at all in the write mode.

The circuits of FIGS. 5 and 7 also have a further disadvantage. Sometimes it is desirable to have moderate damping during the read mode, since the analog read signal may also be subject to ringing effects. In this case, the damping resistance required may be much higher than that needed during a write operation.

SUMMARY OF THE PRESENT INVENTION

An apparatus for damping the ringing effects across the head I/O terminals of a read/write circuit during write operation is described. The present invention introduces a continuous damping resistance across the inductive load of the read/write head during the write operation, and automatically removes the damping resistance during the read operation.

In the preferred embodiment of the present invention, the damping circuit is built into the write driving circuitry. The drive circuitry for each head provides an output terminal for each end of the head inductor coil so as to sink or source current through each end of the inductor. The drive circuitry comprises a current source transistor and a current drain transistor coupled to each output terminal. At any moment in time during a write operation, the current drain transistor of one output terminal is operating while the current source transistor of the second output terminal is operating.

Damping is accomplished by providing a second emitter on each of the current source transistors and coupling each of the second emitters to the opposite output terminal through a damping resistor. When each current source transistor is operating, AC signals across the output terminals see the damping resistance associated with the operating current source transistor as being coupled directly across the output terminals, thus attenuating ringing signals. Due to the integration of the damping circuitry with the write driving circuitry, when the head is performing a read operation, the write driving circuitry is turned off and the damping resistance path between the output terminals automatically becomes an open circuit. In another embodiment of the present invention, a transistor with its base coupled to the base of the current source transistor and its emitter coupled to the damping resistance is utilized in place of the second emitter on the current source transistors.

The circuit of the present invention also allows for a damping resistance suitable for read mode attenuation to be placed directly across the output terminals. The equivalent damping resistance during the write mode is then the resistance of the read damping resistance in parallel with the resistance of one of the resistors at the emitters of the current sourcing transistors.

BRIEF DESCRIPTIONS OF THE DRAWINGS

DETAILED DESCRIPTION OF THE PRESENT INVENTION

An apparatus for damping the ringing effect across a reactive load is described. In the following description, numerous specific details are described in order to provide a more thorough description of the present invention. It will be apparent, however, to one skilled in the art, that the present invention may be practiced without these specific details. In other instances, well known features have not been described in detail so as not to obscure the present invention. The present invention is not limited exclusively to use in a head driving system, but may be utilized in other reactive load systems.

The present invention is a circuit that provides a damping resistance across the inductive load of a read/write head. The design of the present invention provides for automatic switching of the damping circuit such that the damping resistance may be infinite during read operations. The write drive circuitry is utilized to switch currents through the inductive coil of the head. Because the load to the current driving circuitry is made up of the head inductance in parallel with the circuit and stray capacitances, the current through the inductor is subject to ringing conditions when given stepped current inputs. With the addition of the damping resistance across the output terminals, the current ringing signal element is exponentially damped, providing the write circuit with a smaller settling time and a corresponding increase in operating frequency.

By integrating the damping circuitry into the write driving circuitry, the ability is provided for the damping resistance to be automatically switched out of the circuit when the write circuitry is shut off. This prevents the damping resistance from degrading the detection capability of the read circuitry due to over-attenuation of the analog read signal.

For the case when some attenuation of the read signal is desired to diminish ringing conditions, a read damping resistance is coupled across the head I/O nodes. This read damping resistance is of much higher resistance than the write damping resistance so as to provide attenuation of the ringing signal without degradation in the detection of the true analog read signal. The smaller write damping resistance is made up of the read damping resistance in parallel with the write damping resistance that is only switched into the circuit during write operations.

Figure 8:
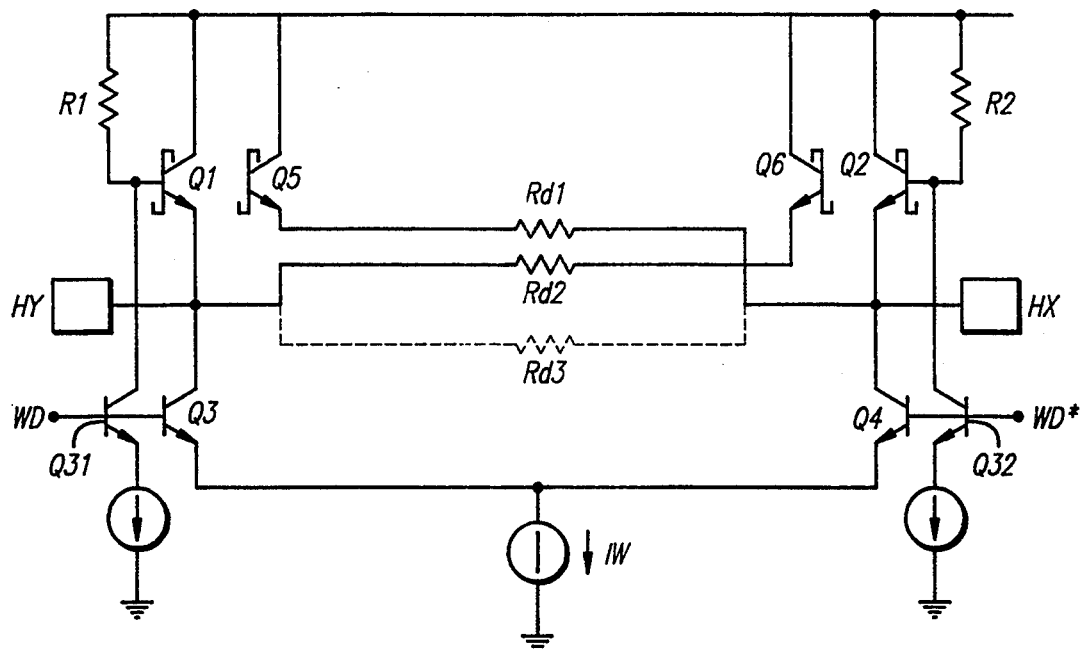
FIG. 8 is a circuit diagram of one embodiment of the present invention.

One embodiment of the present invention is illustrated in FIG. 8. Terminals HX and HY are each coupled to one end of the head inductor. Emitter coupled NPN transistors Q3 and Q4 have collectors coupled to terminals HY and HX, respectively. The emitters of transistors Q3 and Q4 are coupled to current sinking circuitry that is responsible for setting the value of the write current (not shown). The base of transistor Q3 is coupled to signal WD, and thus serves to sink current from terminal HY when signal WD is high. The base of transistor Q4 is coupled to signal WD*, and thus serves to sink current from terminal HX when signal WD* is high. NPN transistors Q1 and Q2, which may be Schottky transistors, have collectors coupled to the positive voltage supply (VCC) and emitters coupled to terminals HY and HX, respectively. The bases of transistors Q1 and Q2 are coupled to bias resistors R1 and R2 respectively. NPN transistors Q5 and Q6, which may be Schottky transistors, have collectors coupled to VCC and have bases coupled to the bases of transistors Q1 and Q2, respectively. The emitter of transistor Q5 is coupled through Rd1 to terminal HX. The emitter of transistor Q6 is coupled through resistor Rd2 to terminal HY. The collectors of transistors Q31 and Q32 are coupled to the bases of transistors Q1 and Q2, respectively. The bases of transistors Q31 and Q32 are coupled to WD and WD*, respectively, and the emitters of Q31 and Q32 are coupled to respective current sources.

Figure 1:
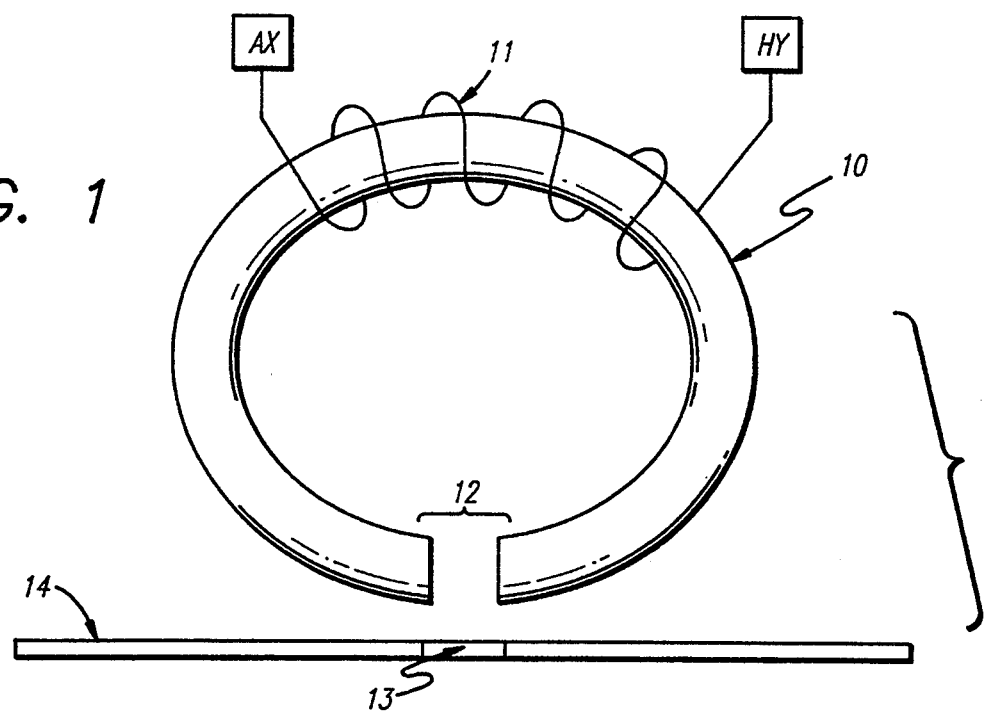
FIG. 1 is a diagram of a slit toroid read/write head.
Figure 3:
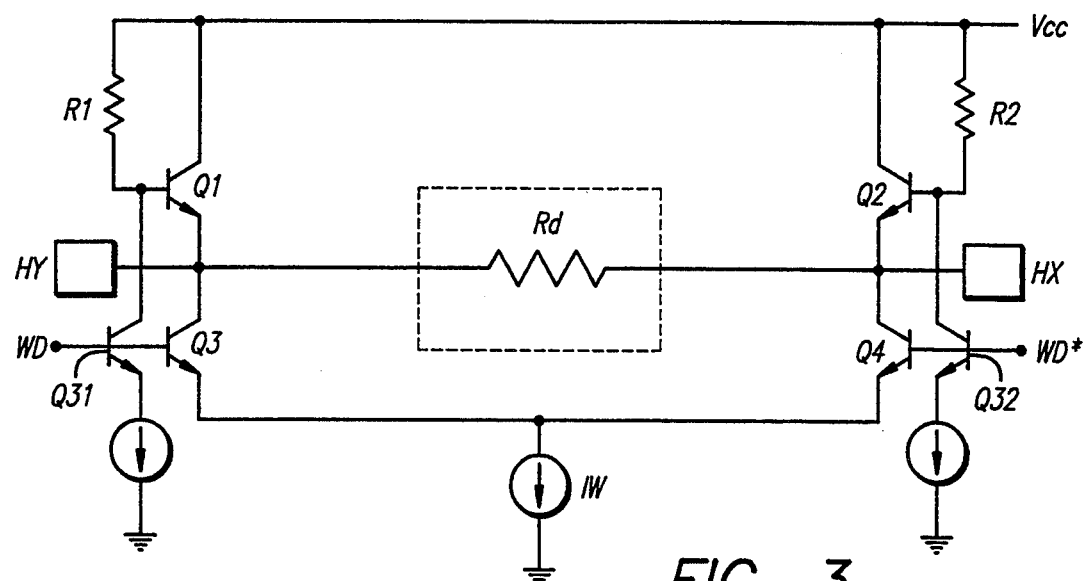
FIG. 3 is a circuit diagram of a prior art damping scheme.
Figure 2:
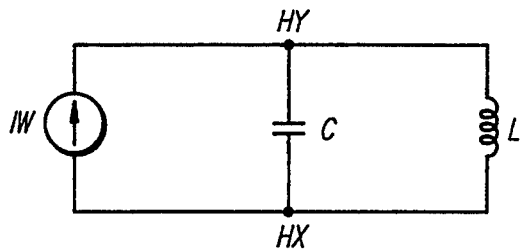
FIG. 2 is a circuit diagram of an equivalent LC load circuit for FIG. 1.
Figure 4:
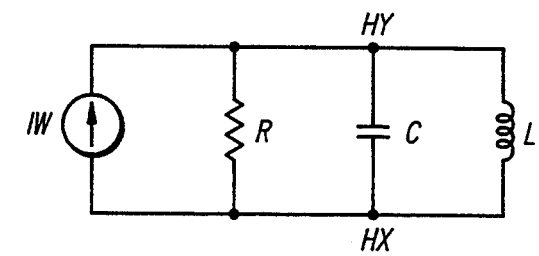
FIG. 4 is a circuit diagram of an equivalent LRC load circuit for FIG. 3.

As was described in the operation of the drive circuitry of FIG. 3, transistor Q3 sinks the current from transistor Q2 when signal WD is high. Transistor Q4 sinks the current from transistor Q1 when signal WD* is high. When the circuit is in read mode or in idle mode, the write current is shut off and no current sinking is provided and the bases of Q1 and Q2 are pulled low, therefore the write circuitry is shut off. In write mode, when signal WD is high, the voltage at the base of transistor Q2 is roughly 0.7 volts higher than the voltage at terminal HX. Also, the voltage at the emitter of transistor Q6 is approximately 0.7 volts lower than the voltage at the base of transistors Q2 and Q6. Therefore, the voltage at the emitter of transistor Q6 is equivalent to the voltage at terminal HX, and the voltage across resistor Rd2 is $V_{HX}-V_{HY}$. Therefore, it appears that a resistance of Rd2 is coupled directly between terminals HX and HY. At this time, the base of transistors Q5 and Q1 are pulled low by transistor Q31 so that the base to emitter voltages of Q5 and Q1 are reversed biased, automatically extracting the resistance Rd1 from the circuit. For the case when signal WD* is high, the opposite situation is true and the resistor Rd1 is effectively coupled between terminals HX and HY, and resistor Rd2 is effectively extracted from the circuit. Thus either Rd1 or Rd2 generates the damping factor of the circuit during their respective write modes, WD* and WD.

When it is desired that the ringing effects during read mode be attenuated, resistor Rd3 is coupled directly across terminals HX and HY in the circuit of FIG. 8. This causes the read circuit to see a damping resistance Rd3 across terminals HX and HY in read mode, whereas in write mode, the circuit sees either a damping resistance of Rd1 in parallel with Rd3, or Rd2 in parallel with Rd3. For write damping purposes, it is desired to have a small resistance to achieve the greatest damping possible. This generates a faster settling rate and thus a higher maximum operating rate. For read damping purposes, the damping must be less because the analog read signal is also subject to attenuation. Therefore, a suitable resistance value is chosen for Rd3 to provide the read damping. Then, a resistance value for Rd1 and Rd2 is chosen such that the parallel resistances, Rd1 || Rd3 and Rd2 || Rd3, are the desired write damping resistance value.

Figure 9:
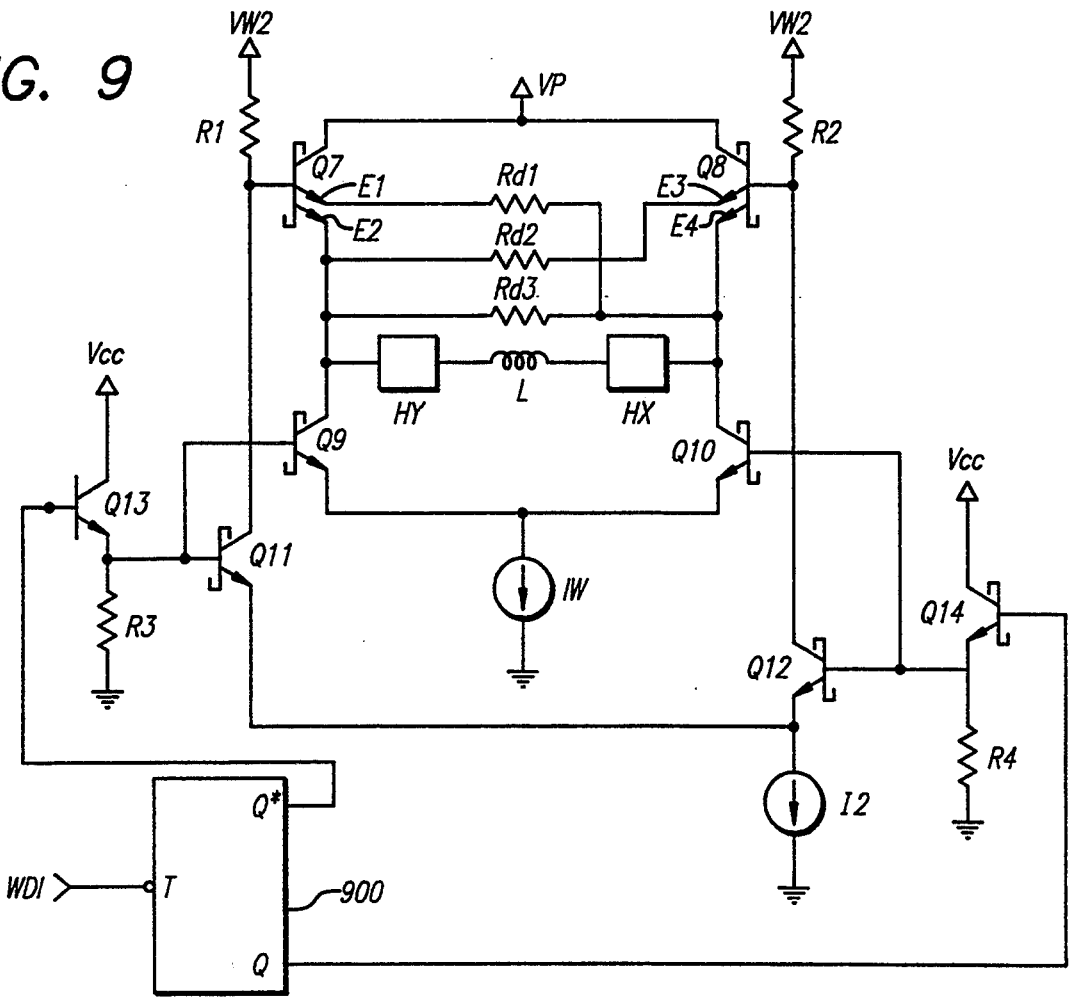
FIG. 9 is a circuit diagram of the preferred embodiment of the present invention.

The preferred embodiment of the present invention is illustrated in FIG. 9. In FIG. 9, further driving circuitry is disclosed to illustrate one possible driving environment for the invention. However, the present invention can be practiced using alternative forms of driving circuitry and current sinking circuitry. The circuit can be practiced using PNP transistors by inverting the polarities of the circuit elements.

In FIG. 9, toggle flip-flop 900 receives the write data input signal (WDI) as the toggle input (T) and generates outputs Q and Q*. Q and Q* are toggled at each high to low transition of WDI. Toggle output Q* is coupled to the base of NPN transistor Q13, and toggle output Q is coupled to the base of NPN transistor Q14. The collectors of transistors Q13 and Q14 are coupled to the VCC voltage supply to form emitter followers. The emitter of transistor Q13 is coupled to the bases of NPN Schottky transistors Q9 and Q11, and through resistor R3 to ground. The emitter of transistor Q14 is coupled to the bases of NPN Schottky transistors Q10 and Q12, and through resistor R4 to ground. The emitters of Schottky transistors Q11 and Q12 are coupled together to one terminal of current source I2. A second terminal of current source I2 is coupled to ground. The collector of Schottky transistor Q11 is coupled to the base of Schottky transistor Q7 and through resistor R1 to the VW2 voltage supply. The collector of Schottky transistor Q12 is coupled to the base of Schottky transistor Q8 and through resistor R2 to the VW2 voltage supply. The collectors of Schottky transistors Q7 and Q8 are coupled to the VP voltage supply. In a single power supply system, VP and VW2 are set to VCC. However, in a system where at least two power supplies are available (e.g. 5 volts and 12 volts), VP and VW2 are coupled to the higher voltage supply to allow for a larger voltage swing across the head.

Schottky transistors Q7 and Q8 have two emitters each, E1 and E2, and E3 and E4, respectively. Emitter E1 is coupled through damping resistor Rd1 to terminal HX, and emitter E2 is coupled to terminal HY. Emitter E3 is coupled through damping resistor Rd2 to terminal HY, and emitter E4 is coupled to terminal HX. Read damping resistor Rd3 is optionally coupled between terminals HX and HY. Inductor L, representing the head inductance, is shown coupled to terminals HX and HY. The collector of Schottky transistor Q9 is coupled to terminal HY. The collector of Schottky transistor Q10 is coupled to terminal HX. The emitters of Schottky transistors Q9 and Q10 are coupled together to one terminal of current source IW. A second terminal of current source IW is coupled to ground. Current source IW specifies the write current value. In this embodiment, Schottky transistors are used in the circuitry where the operation of crucial transistors might enter the saturation region and thus reduce the switching speed of the circuit.

The emitter followers formed by transistors Q13 and Q14 act as buffers between the toggle flip-flop and the rest of the drive circuitry. This decreases the load on the flip-flop. When the Q output of flip-flop 900 toggles high and Q* toggles low, transistor Q12 turns on, pulling the base of transistor Q8 low, and transistor Q11 turns off, allowing the base of transistor Q7 to go high. Thus, transistor Q8 is switched off, switching resistor Rd2 out of the damping circuit, and transistor Q7 is switched on, switching resistor Rd1 into the damping circuit. In addition, transistor Q10 is switched on and transistor Q9 is switched off.

When the Q* output of flip-flop 900 toggles high and Q toggles low, transistor Q11 turns on, pulling the base of transistor Q7 low, and transistor Q12 turns off, allowing the base of transistor Q8 to go high. Thus, transistor Q7 is switched off, switching resistor Rd1 out of the damping circuit, and transistor Q8 is switched on, switching resistor Rd2 into the damping circuit. Transistor Q9 is switched on and transistor Q10 is switched off.

Figure 5:
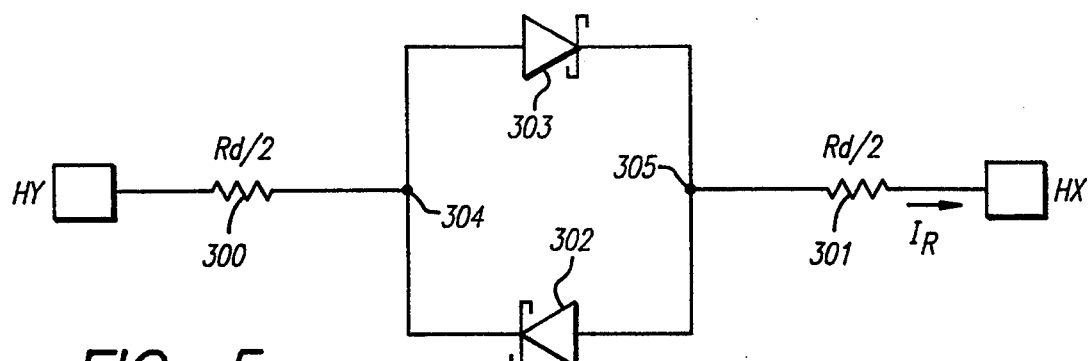
FIG. 5 is a circuit diagram of a prior art Schottky isolated damping scheme.
Figure 6:
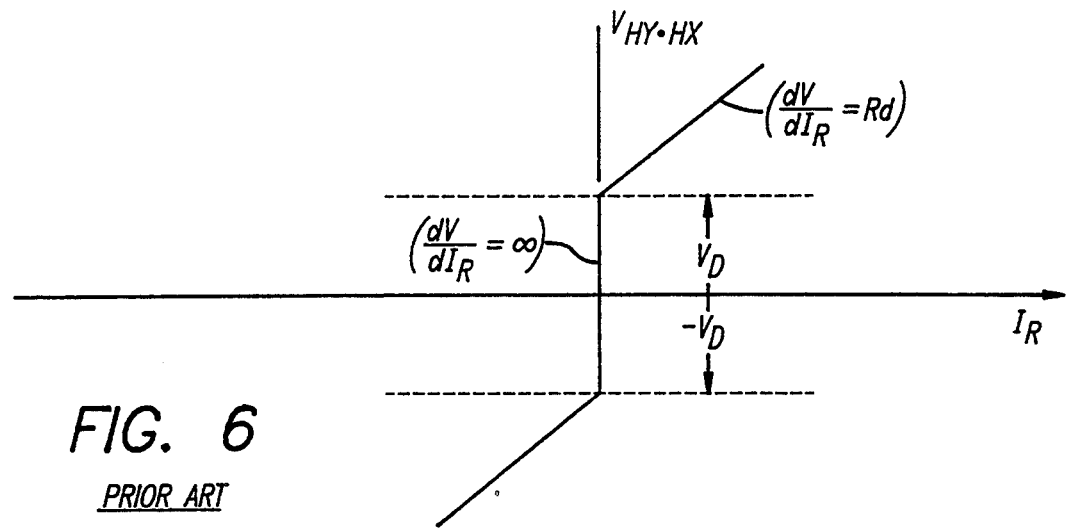
FIG. 6 is a graph of the voltage-current characteristics of the Schottky isolated damping scheme.
Figure 7:
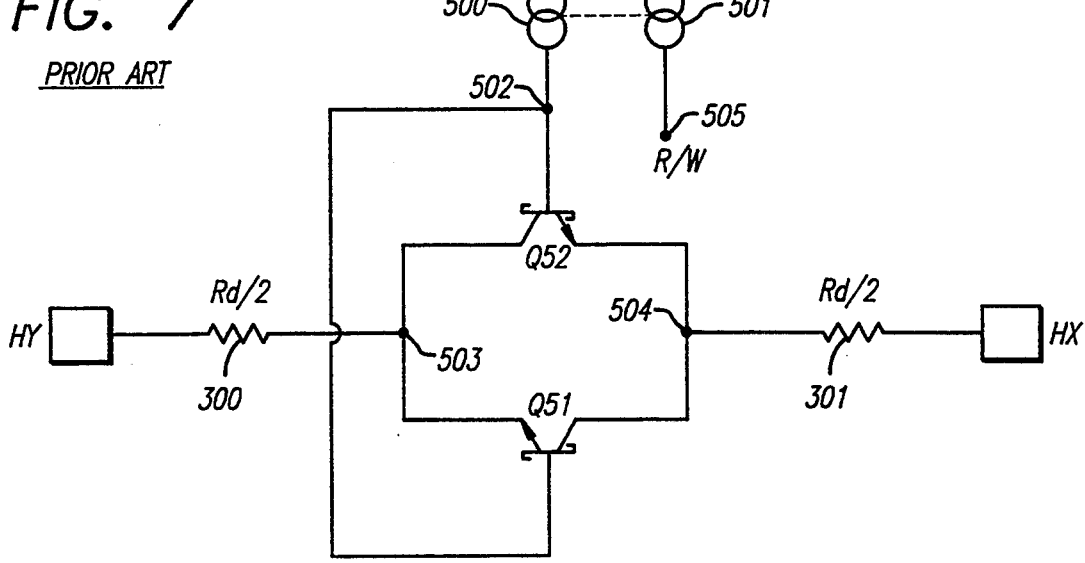
FIG. 7 is a circuit diagram of a prior art switched Schottky clamp damping scheme.

The damping circuit in FIG. 9 allows for the switched damping to be accomplished with a minimum of circuitry and IC layout area usage. This damping circuit requires only one additional resistor (two, if Rd3 is used) and the addition of one extra emitter on two already existing transistors to achieve its function. In contrast, the prior art circuit of FIG. 5 requires at least two additional Schottky diodes that may take up a relatively larger area on the IC layout. Also the prior art circuit of FIG. 7 requires the addition of two Schottky transistors and current switching circuitry. The preferred embodiment of the present invention not only minimizes layout area and the number of extra circuit elements, but it also provides linear voltage versus current characteristics and a choice of a read damping resistance.

Figure 10:
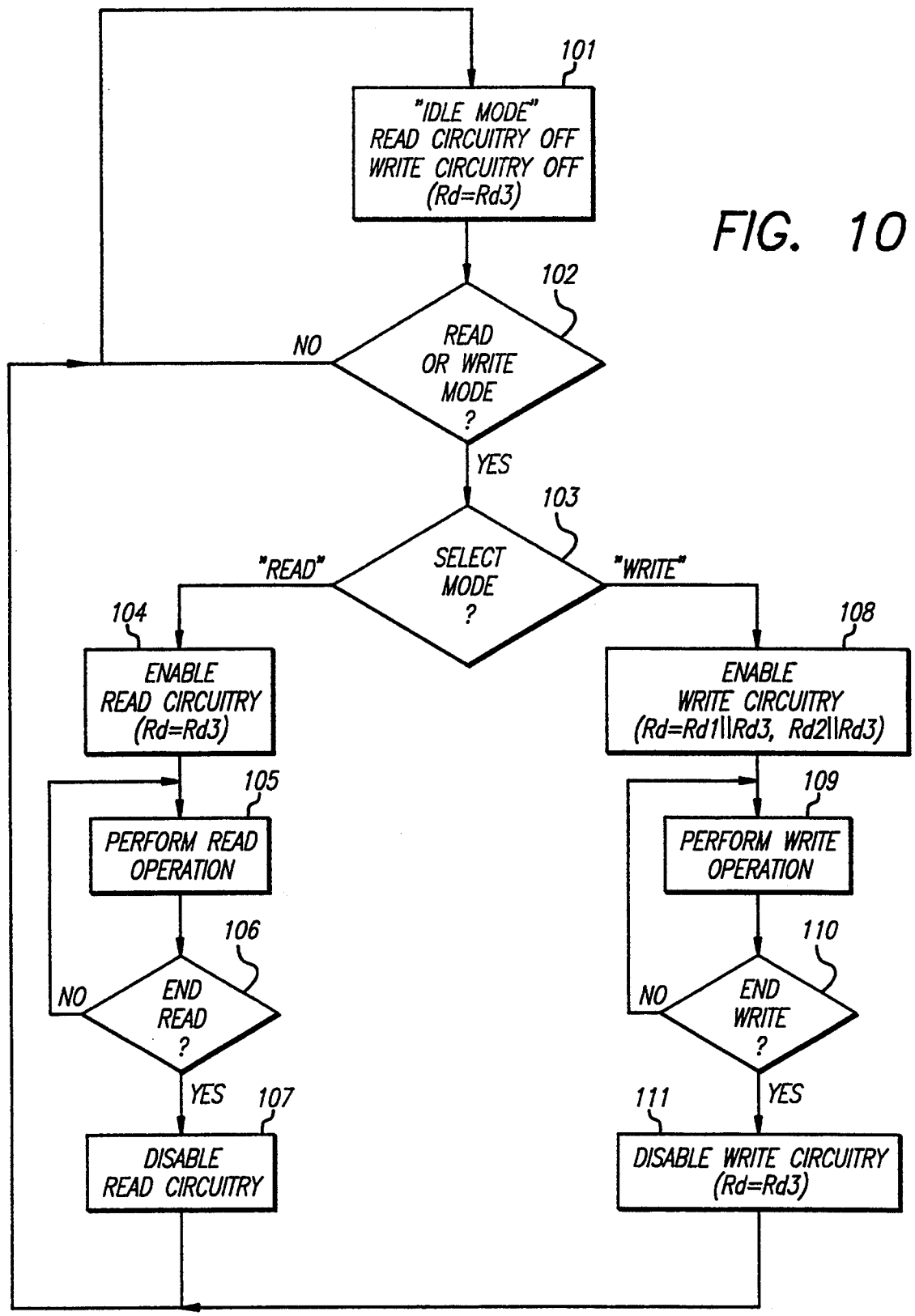
FIG. 10 is a flow diagram of the basic operation of the read/write circuitry of the present invention.

A flow diagram illustrating the operation of the read/write circuitry is shown in FIG. 10. In block 101, the magnetic storage system is not performing a write or a read operation and, therefore, the read circuitry and the write circuitry are off. This operating condition is termed "idle mode." Because the write circuitry is off, the damping resistance is equivalent to the read damping resistance, Rd3, which may be chosen to be an open circuit. As indicated by decision block 102, the system will remain in idle mode until a read or write operation is called for by the associated electronic processing system( e.g. personal computer), at which time the flow of operation proceeds to decision block 103. Flow progresses to block 104 if the selected operation is a read operation, or to block 108 if the selected operation is a write operation.

In block 104, the read circuitry is enabled and operation proceeds to block 105, where the read operation is performed. Decision block 106 feeds back to block 105 to until the read operation is completed. After completion of the read operation, the read circuitry is disabled, and the system returns to idle mode at block 101.

In block 108, the write circuitry is enabled, automatically coupling the additional damping circuitry to the system (i.e. turning on transistors Q7 and Q8). Thus the damping resistance becomes equivalent to Rd3 || Rd1 or Rd3 || Rd2. The write operation is performed in subsequent block 109. After the write operation is completed, decision block 110 directs operation to block 111, where the write circuitry is disabled and damping resistances Rd1 and Rd2 are electrically removed from the circuit (i.e. turning off transistors Q7 and Q8). Then operation returns to idle mode at block 101.

Thus a self-switching head damping scheme has been described.

I claim:

1. A damping circuit comprising:
a first transistor having an emitter terminal coupled to a first loading node, a collector terminal coupled to a power supply and a base terminal resistively coupled to said power supply;
a second transistor having an emitter terminal coupled to a second loading node, a collector terminal coupled to said power supply and a base terminal resistively coupled to said power supply;
a current switching circuit coupled to said first and second loading nodes, said current switching circuit alternately coupling said first and second loading nodes to a current source;
a third transistor having base and collector terminals coupled to said base and collector terminals, respectively, of said first transistor, said third transistor having an emitter terminal coupled through a first damping resistor to said second loading node;
a fourth transistor having base and collector terminals coupled to said base and collector terminals, respectively, of said second transistor, said fourth transistor having an emitter terminal coupled through a second damping resistor to said first loading node;
a substantially reactive load coupled to said first and second loading nodes.

2. The circuit of claim 1 further comprising a third damping resistor coupled between said first and second loading nodes.

3. The circuit of claim 1 wherein:
said circuit is further coupled to driving circuitry for a magnetic recording head;
said substantially reactive load comprises circuit capacitance in combination with a primarily inductive load presented by said recording head;
said current switching circuit switches current polarity between said first and second loading nodes in response to write input signals;
said current source is shut off when said driving circuitry is not in a write mode.

4. The circuit of claim 1 wherein said transistors comprise NPN transistors.

5. The circuit of claim 4 wherein said transistors comprise Schottky transistors.

6. The circuit of claim 1 wherein said transistors comprise PNP transistors.

7. A damping circuit comprising:
a first transistor having a first emitter terminal coupled to a first loading node, a second emitter terminal coupled through a first damping resistor to a second loading node, a collector terminal coupled to a power supply and a base terminal resistively coupled to said power supply;
a second transistor having a first emitter terminal coupled to said second loading node, a second emitter terminal coupled through a second damping resistor to said first loading node, a collector terminal coupled to said power supply and a base terminal resistively coupled to said power supply;
a current switching circuit coupled to said first and second loading nodes, said current switching circuit alternately coupling said first and second loading nodes to a current source;
a substantially reactive load coupled to said first and second loading nodes.

8. The circuit of claim 7 further comprising a third damping resistor coupled between said first and second loading nodes.

9. The circuit of claim 7 wherein:
said circuit is further coupled to driving circuitry for a magnetic recording head;
said substantially reactive load comprises circuit capacitance in combination with a primarily inductive load presented by said recording head;
said current switching circuit switches current polarity between said first and second loading nodes in response to write input signals;
said current source is shut off when said driving circuitry is not in a write mode.

10. The circuit of claim 7 wherein said transistors comprise NPN transistors.

11. The circuit of claim 10 wherein said transistors comprise Schottky transistors.

12. The circuit of claim 7 wherein said transistors comprise PNP transistors.

* * * * *